US006406956B1

United States Patent
Tsai et al.

(10) Patent No.: US 6,406,956 B1
(45) Date of Patent: Jun. 18, 2002

(54) POLY RESISTOR STRUCTURE FOR DAMASCENE METAL GATE

(75) Inventors: Ming-Hsing Tsai; Chii-Ming Wu, both of Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/845,483

(22) Filed: Apr. 30, 2001

(51) Int. Cl.[7] .................. H01L 21/8238; H01L 21/338; H01L 21/8234
(52) U.S. Cl. ........................ 438/201; 438/185; 438/238
(58) Field of Search .................. 438/238, 239–399, 438/183, 201

(56) References Cited

U.S. PATENT DOCUMENTS

| | | | |
|---|---|---|---|
| 4,212,684 A | | 7/1980 | Brower .................. 148/1.5 |
| 5,759,886 A | | 6/1998 | Chang .................. 438/231 |
| 5,780,333 A | * | 7/1998 | Kim ..................... 438/238 |
| 5,837,592 A | * | 11/1998 | Chang et al. .......... 438/238 |
| 5,856,225 A | * | 1/1999 | Lee et al. .............. 438/291 |
| 5,866,947 A | * | 2/1999 | Wang et al. ............ 257/748 |
| 6,033,963 A | * | 3/2000 | Huang et al. .......... 257/368 |
| 6,093,628 A | * | 7/2000 | Lim et al. ............. 438/571 |
| 6,117,743 A | | 9/2000 | Yeh et al. .............. 438/301 |
| 6,121,078 A | | 9/2000 | DeBrosse et al. ....... 438/183 |
| 6,171,910 B1 | * | 1/2001 | Hobbs et al. ........... 438/275 |
| 6,184,114 B1 | * | 2/2001 | Lukanc ................ 438/197 |
| 6,221,776 B1 | * | 4/2001 | Smith .................. 148/33.5 |
| 6,251,729 B1 | * | 6/2001 | Montree et al. ........ 438/257 |
| 6,255,698 B1 | * | 7/2001 | Gardner et al. ......... 257/369 |
| 6,261,935 B1 | * | 7/2001 | See et al. ............... 438/592 |
| 6,284,609 B1 | * | 9/2001 | Ang et al. ............. 438/197 |
| 6,297,107 B1 | * | 10/2001 | Paton et al. ........... 438/197 |
| 6,300,201 B1 | * | 10/2001 | Shao et al. ............ 438/281 |
| 6,303,418 B1 | * | 10/2001 | Cha et al. ............. 438/199 |
| 6,333,223 B1 | * | 12/2001 | Moriwaki et al. ....... 438/241 |
| 6,333,540 B1 | * | 12/2001 | Shiozawa et al. ....... 257/351 |

* cited by examiner

Primary Examiner—Trung Dang
Assistant Examiner—Brook Kebede
(74) Attorney, Agent, or Firm—George O. Saile; Stephen B. Ackerman

(57) ABSTRACT

A layer of gate oxide and polysilicon are deposited over the surface of a substrate, these layers are etched to create a dummy gate and a resistor. Spacers are formed on the dummy gate and the resistor, suitable impurities are implanted self-aligned with the dummy gate. A layer of dielectric is deposited and polished down to the surface of the dummy gate and the polysilicon resistor, the dummy gate is removed creating an opening in the layer of dielectric. A high-k dielectric is deposited over which a layer of metal is deposited, the surface of the layer of metal and high-k dielectric are polished down to the surface of the layer of dielectric leaving in place a metal gate electrode and a polysilicon resistor.

19 Claims, 6 Drawing Sheets

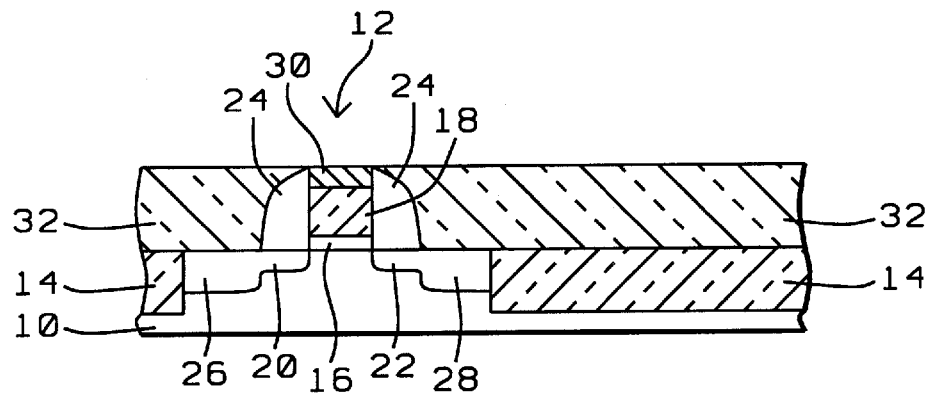
FIG. 1 - Prior Art
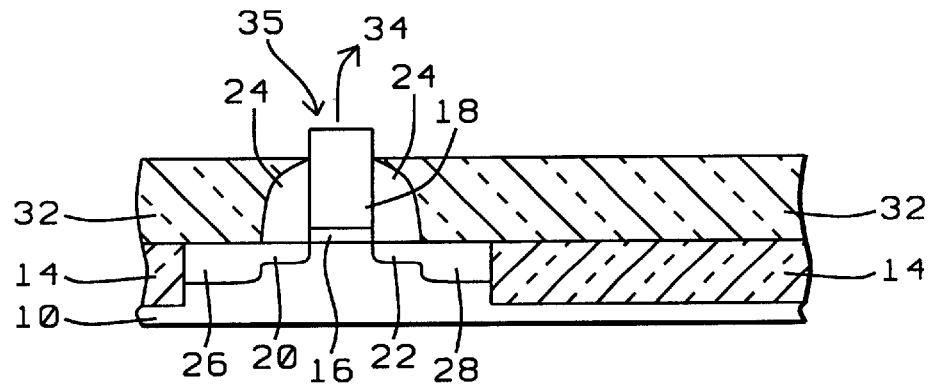
FIG. 2 - Prior Art
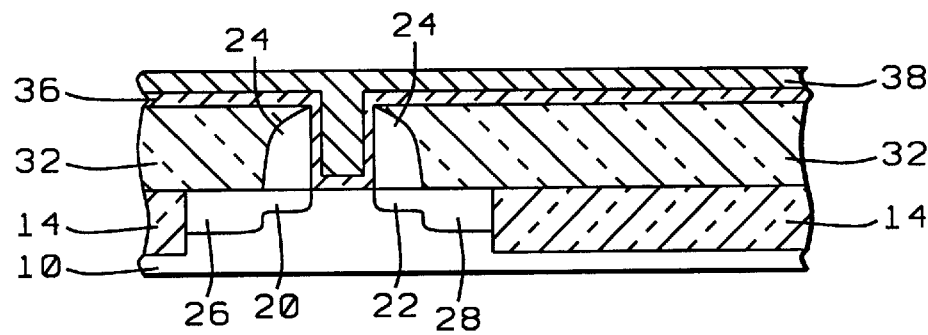
FIG. 3 - Prior Art

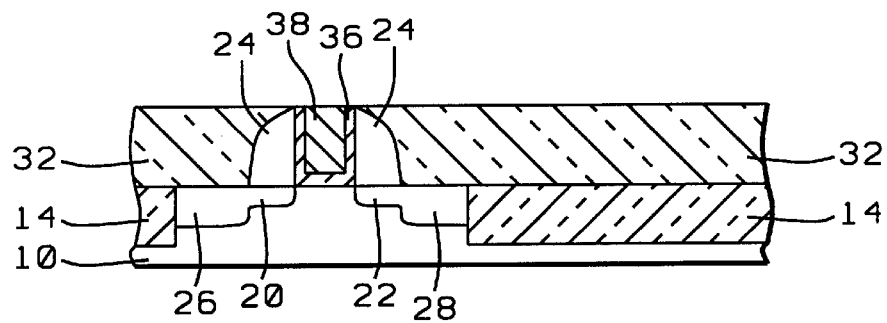
FIG. 4 - Prior Art
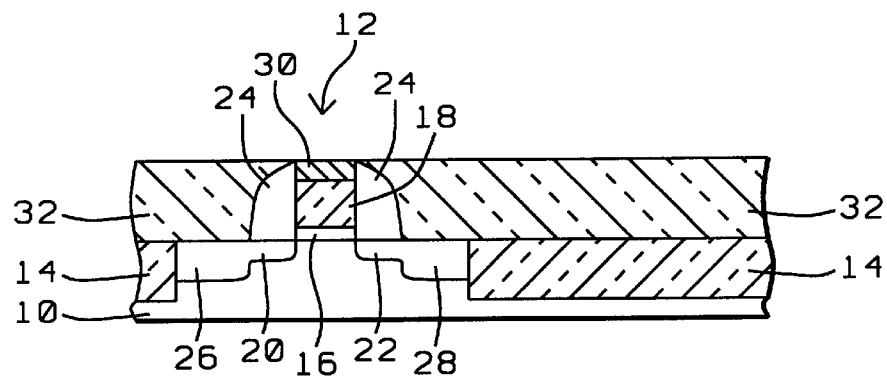
FIG. 5 - Prior Art
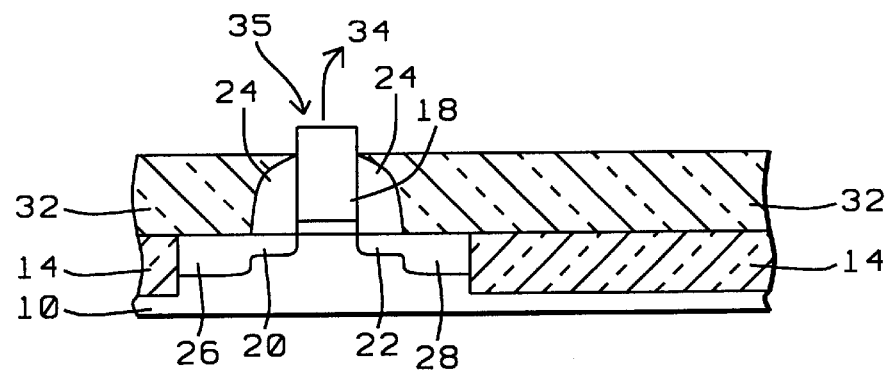
FIG. 6 - Prior Art

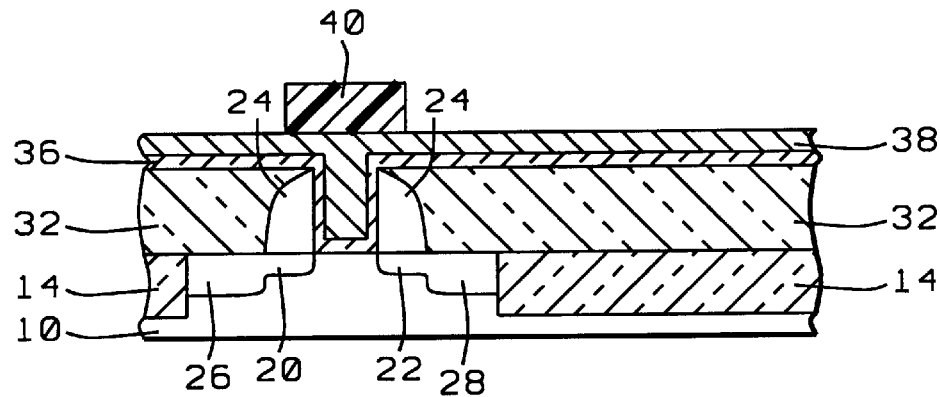
FIG. 7 - Prior Art
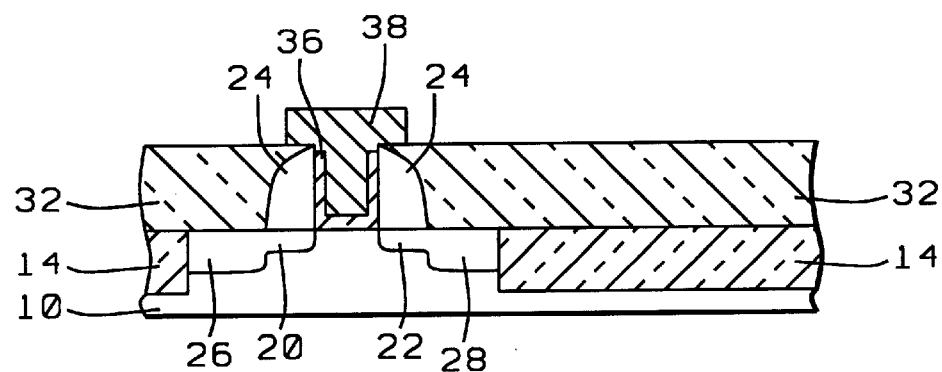
FIG. 8 - Prior Art

POLY RESISTOR STRUCTURE FOR DAMASCENE METAL GATE

BACKGROUND OF THE INVENTION

(1) Field of the Invention

The invention relates to the fabrication of integrated circuit devices, and more particularly, to a method for the simultaneous formation of a metal gate for CMOS devices using a replacement gate process and a polysilicon resistor.

(2) Description of the Prior Art

Conventional methods of creating CMOS devices use gate electrodes of polysilicon that is deposited and patterned over a layer of gate oxide, in many applications the surface of the patterned and etched layer of polysilicon is salicided in order to meet requirements of low contact sheet resistivity. With the continued decrease in device and device feature dimensions, the polysilicon of the gate electrode is more prone to depletion of the polysilicon which results in a significant reduction in device performance. Polysilicon depletion results in increased resistivity of the layer of polysilicon, which in turn results in an increase of the voltage drop across the polysilicon gate electrode when this electrode is reverse mode biased. To address and largely negate this problem and in view of the fact that metal is a good conductor, the industry in increasingly turning to the use of metal to create gate electrodes. Metal however is susceptible to migration to surrounding regions under conditions of elevated temperature that can arise during the process of creating the CMOS device. The gate length of CMOS devices is the distance between the source and the drain regions of the device where this distance extends underneath the gate electrode. With the continued decrease in device dimensions, the gate length for sub-micron devices has been decreased to 0.25 $\mu$m or less. For such small gate length, the control of the Critical Dimension (CD) of this parameter becomes a challenge. To address this aspect of metal gate electrode design, the approach has been provided whereby a dummy gate is first created. This dummy gate uses a dielectric, such as silicon dioxide or a polymer, for the body of the gate. The area surrounding the gate electrode is shielded by the deposition of a layer of for instance oxide, an opening is created in this layer of oxide that aligns with the surface of the gate electrode after which the dummy gate is removed. The opening that is created in this manner can now be filled with new dielectrics first, for instance silicon dioxide or other high-k material, and filled with metal. Polishing of the surface of the deposited metal completes the creation of the sub-micron metal gate electrode. Critical in this process is the ability to control the end-point of the polishing step, since this end-point determines the height of the gate electrode and therefore the performance of the CMOS device.

As part of creating semiconductor devices, resistors are frequently required that have a high value of resistivity. Conventional processes create the gate electrode and the high resistivity resistor as two different steps, that is the gate electrode is typically first created after which the resistor is created. This implies a duality of processing steps that incurs unnecessary processing cost.

The prior art processing steps that are applied for the creation of a metal gate electrode will be described following. Referring to FIG. 1 there is shown a cross section of a semiconductor surface 10, preferably the surface of a monocrystalline silicon substrate, on the surface of which a gate electrode 12 has been created. Isolation regions 14 have been formed in the surface of surface 10 in order to define and electrically isolate active surface regions in the surface of layer 10. After the regions 14 of for instance Field Oxide (FOX) or of Shallow Trench Isolation (STI) have been created, a layer 16 of pad oxide is created over the surface of substrate 10 by methods of either Chemical Vapor Deposition (CVD) or by exposing the surface of substrate 10 to an oxidizing environment under elevated temperatures.

After the layer 16 of pad oxide has been created, a dummy gate electrode layer 18 is formed by depositing polysilicon. Conventional methods of photolithography and anisotropic etching are applied to the layers 16 of pad oxide and 18 of polysilicon to form the patterned layers 16 and 18 that are shown in cross section in FIG. 1.

Lightly Doped (LDD) source implant 20 and drain implant 22 are performed next that are self-aligned with the gate structure 16/18 and that extend laterally along the surface of substrate 10 in the immediate adjacency of the gate electrode structure 16/18. Dependent on the type of device that is being created, that is a NMOS or a PMOS device, these implants are either n-type or p-type impurities. Gate spacers 24 typically have a thickness of between 300 and 2000 Angstrom.

Source region 26 and drain region 28 are next formed in the surface of substrate 10. For NMOS devices, the implants for the source and drain regions use n-type impurities such as arsenic or phosphorous, for PMOS devices a p-type implant such as indium or boron can be used. The surface of the gate electrode structure 16/18 can next be salicided in order to reduce the contact resistance with the gate electrode. This salicing of the surface of the gate electrode at the same time salicides the surface regions of the source and drain regions of the gate electrode.

Layer 30 of the gate electrode has been highlighted as being a salicided layer since the process of salicidation can be performed simultaneously with saliciding the source and drain contact points of the gate structure. For the creation of layer 30 tungsten can be applied.

Further shown in cross section in FIG. 1 is the deposition of a blanket layer 32 over the dummy gate electrode 12 and the exposed surface of substrate 10, thereby including the surface of the isolation regions 14. This layer 32 of dielectric, preferably containing silicon dioxide, is deposited to a thickness such that the surface of layer 32 is at least equal to the surface of the salicided layer 30 on the surface of the dummy gate electrode 16/18. Dielectric that has been deposited exceeding this height can be removed by Chemical Mechanical Polishing or by methods of etching. Layer 30 of salicided material is of higher hardness than the surface of the layer 32 of dielectric that is being polished and can therefore serve as a stop layer for the CMP process.

FIG. 2 shows the removal 34 of the dummy gate electrode comprising the layers 16, 18 and 30 from between the gate spacers 24, forming an opening 35 between the gate spacers 24. The dummy gate can be removed using conventional methods of etch. The layer 16 of pad oxide can be removed using CHF3/CF4 or HF etch chemistry.

Referring now to FIG. 3, a layer 36 of gate dielectric is deposited over the surface of layer 32 and the inside surfaces of opening 35 that has been created between gate spacers 24. Over the surface of the dielectric layer 36 is deposited a layer 38 of metal that is deposited to a thickness sufficient to fill opening 35. The gate electrode can further comprise a barrier layer, copper interconnects should be encapsulated by at least one diffusion barrier to prevent diffusion into the silicon dioxide layer. Silicon nitride is a diffusion barrier to copper, the prior art teaches that copper interconnects should not lie on a silicon nitride layer because it has a high dielectric constant compared with silicon dioxide. The high dielectric constant when applied with interconnects causes an undesired increase in capacitance between the interconnects and the substrate. For the case of a metal gate electrode, a high-k dielectric is required for the metal structure making silicon nitride a desirable dielectric for copper applications.

Referring to FIG. 4, this cross section shows the results that are obtained by polishing layers 38 and 36 down to the surface of the layer 32 of dielectric.

The metal gate electrode that is shown. in cross section in FIG. 4 provides a metal gate with a damascene type plug. As an alternate process, the surface of the metal gate electrode can be extended as is shown in cross section in FIGS. 5 through 8. FIGS. 5 and 6 are identical with FIGS. 1 and 2 and therefore do not need to be further addressed at this time. FIG. 7 is partially identical with FIG. 3, the difference between FIG. 3 and FIG. 7 is that in FIG. 7 a layer 40 of photoresist has been deposited and patterned and etched over the surface of the layer 38 of metal. The patterning and etching has removed the layer 40 of photoresist in the surface regions of layer 38 that surrounds the gate electrode 12, leaving a patterned layer 40 in place overlying the gate electrode. By using the patterned layer 40 of photoresist as a mask, layers 36 and 38 can be removed from the surface of the layer 32 of dielectric except in the surface regions of layer 38 where the patterned layer 40 of photoresist prevents the removal of these layers. This leads to a cross section that is shown in FIG. 8, whereby the gate electrode has been provided with a cap for improved connectivity to the gate electrode. After layers 36 and 38 have been etched as indicated, the patterned layer 40 of photoresist is removed from the surface of layer 38.

The metal gate structure that is shown in cross section in FIG. 4 is referred to as a damascene metal gate structure, the metal gate structure that is shown in cross section in FIG. 8 is referred to as an etch back metal gate structure.

U.S. Pat. No. 5,759,886 (Chung) shows a process for a metal silicide layer over poly gates.

U.S. Pat. No. 6,121,078 (DeBrosse et al.), U.S. Pat. No. 4,212,684 (Brower), U.S. Pat. No. 6,033,963 (Huang et al.), U.S. Pat. No. 6,117,743 (Yeh et al.) show related patents.

SUMMARY OF THE INVENTION

A principle objective of the invention is to create metal gate structures and polysilicon resistors during one processing sequence.

Another objective of the invention is to eliminate negative impact of high temperature processing on the formation of metal gate structures.

Yet another objective of the invention is to eliminate the need for the creation of polysilicon resistors as one separate processing sequence.

A layer of gate oxide and polysilicon are deposited over the surface of a substrate, these layers are etched to create a dummy gate and a resistor. Spacers are formed on the dummy gate and the resistor, suitable impurities are implanted self-aligned with the dummy gate. A layer of dielectric is deposited and polished down to the surface of the dummy gate and the polysilicon resistor, the dummy gate is removed creating an opening in the layer of dielectric. A high-k dielectric is deposited over which a layer of metal is deposited, the surface of the layer of metal and high-k dielectric are polished down to the surface of the layer of dielectric leaving in place a metal gate electrode and a polysilicon resistor.

BRIEF DESCRIPTION OF THE DRAWINGS

FIGS. 1 through 4 show prior art creation of a damascene type metal gate structure, as follows:

FIG. 1 shows a cross section of a semiconductor surface on the surface of which has been formed a polysilicon gate structure, the polysilicon gate structure is embedded in a layer of dielectric.

FIG. 2 shows a cross section of a semiconductor surface where the polysilicon gate structure is removed from the semiconductor surface.

FIG. 3 shows a cross section of a semiconductor surface from the surface of which the polysilicon gate structure has been removed, a layer of high-k dielectric and a layer of metal have been deposited.

FIG. 4 shows a cross section of a semiconductor surface after the deposited layers of high-k dielectric and metal have been polished down to the surface of the layer of dielectric.

FIGS. 5 through 8 show a prior art creation of an etch back type metal gate structure, as follows:

FIG. 5 shows a cross section of a semiconductor surface on the surface of which has been formed a polysilicon gate structure, the polysilicon gate structure is embedded in a layer of dielectric.

FIG. 6 shows a cross section of a semiconductor surface where the polysilicon gate structure is removed from the semiconductor surface.

FIG. 7 shows a cross section of a semiconductor surface from the surface of which the polysilicon gate structure has been removed. A layer of high-k dielectric and a layer of metal have been deposited, a patterned layer of photoresist has been created on the surface of the layer of metal and overlying the gate electrode.

FIG. 8 shows a cross section of a semiconductor surface after the deposited layers of high-k dielectric and metal have been etched down to the surface of the layer of dielectric, the patterned layer of photoresist has been removed from the surface of the layer of metal.

FIG. 9 shows a cross section of a semiconductor surface on the surface of which has been formed a polysilicon gate structure and a polysilicon resistor, the polysilicon gate structure and the polysilicon resistor are embedded in a layer of dielectric.

FIG. 10 shows a cross section of the semiconductor surface of FIG. 9 after a patterned layer of photoresist has been created overlying the polysilicon resistor, the polysilicon gate structure is being removed from the semiconductor surface, creating an opening in the layer of dielectric.

FIG. 11 shows a cross section of the semiconductor surface of FIG. 10 after the patterned layer of photoresist has been removed from above the polysilicon resistor. A layer of high-k dielectric has been deposited over the surface of the layer of dielectric including the inside surfaces of the opening created in the layer of dielectric, a layer of metal has been deposited over the surface of the high-k dielectric.

FIG. 12 shows a cross section of the semiconductor surface of FIG. 11 after the layer of high-k dielectric and the layer of metal have been removed from the surface of the high-k dielectric.

FIG. 13 shows a cross section of a semiconductor surface on the surface of which has been formed a polysilicon gate structure and a polysilicon resistor, the polysilicon gate structure and the polysilicon resistor are embedded in a layer of dielectric.

FIG. 14 shows a cross section of the semiconductor surface of FIG. 13 after a first patterned layer of photoresist has been created overlying the polysilicon resistor, the polysilicon gate structure is being removed from the semiconductor surface, creating an opening in the layer of dielectric.

FIG. 15 shows a cross section of the semiconductor surface of FIG. 14 after the first patterned layer of photoresist has been removed from above the polysilicon resistor. A layer of high-k dielectric has been deposited over the surface of the layer of dielectric, including the inside surfaces of the opening created in the layer of dielectric. A layer of metal has been deposited over the surface of the high-k dielectric, a second patterned layer of photoresist has been created overlying the gate electrode.

FIG. 16 shows a cross section of the semiconductor surface of FIG. 15 after the layer of high-k dielectric and the layer of metal have been partially removed from the surface of the high-k dielectric in accordance with the second patterned layer of photoresist. The second patterned layer of photoresist has been removed from the surface of the layer of metal.

DESCRIPTION OF THE PREFERRED EMBODIMENTS

Reference numbers that previously have been used for the explanation of prior art processing sequences following FIGS. 1 through 8 have been maintained for FIGS. 9 through 16.

Figure 9:
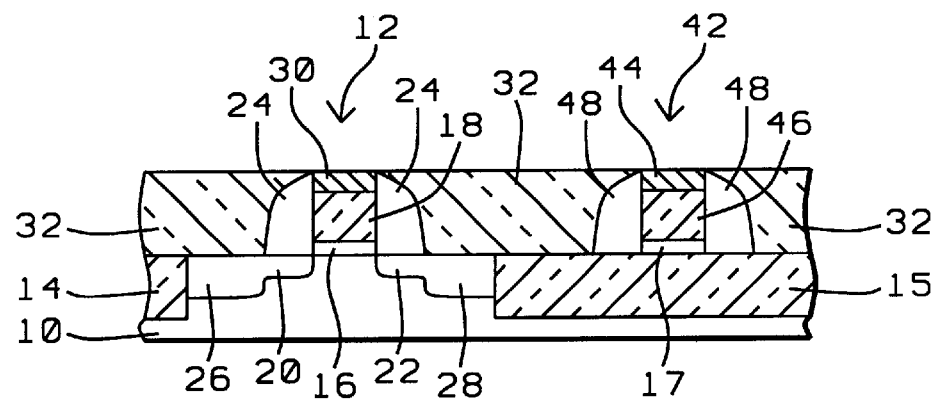
FIGS. 9 through 12 show a cross section of a damascene type metal plug that is created concurrent with the creation of a polysilicon resistor, as follows.

Referring to FIG. 9 there is shown a cross section of a semiconductor surface 10, preferably the surface of a monocrystalline silicon substrate, on the surface of which a gate electrode 12 and a polysilicon resistor 42 have been created. Isolation regions 14 and 15 have been formed in the surface of surface 10 in order to define and electrically isolate active surface regions in the surface of layer 10, the resistive component 42 of the invention will be created on the surface of isolation region 15. After the regions 14 and 15 of for instance Field Oxide (FOX) or of Shallow Trench Isolation (STI) have been created, a layer 16/17 of pad oxide is created over the surface of substrate 10 using methods of either Chemical Vapor Deposition (CVD) or by exposing the surface of substrate to an oxidizing environment under elevated temperatures. Typically, a blanket pad oxide can be formed to a thickness of about 150 Angstrom through a thermal oxidation method at a temperature of about 900 degrees C. for a time period of about 10 to 20 minutes. The layer 16/17 of thin oxide can also be created by applying conventional deposition technology and can, for instance, be deposited using PECVD procedures at a temperature of between about 350 and 450 degrees C. to a thickness between about 125 and 150 Angstrom using TEOS or $SiH_4$ as a source.

After the layer 16/17 of pad oxide has been created, a dummy gate electrode layer 18 and the polysilicon layer 46 are formed by depositing polysilicon to a thickness between about 12000 and 3000 Angstrom over the layer 16/17 of pad oxide. Conventional methods of photolithography and anisotropic etching are applied to the layers of pad oxide and of polysilicon to form the patterned layers 16, 18, 17 and 46 that are shown in cross section in FIG. 9. Layer 16 and 18 are part of gate electrode 12, layers 17 and 46 are part of the polysilicon resistor 42.

Lightly Doped (LDD) source implant 20 and drain implant 22 are performed next that are self-aligned with the gate structure 16/18 and that extend laterally along the surface of substrate 10 in the immediate adjacency of the gate electrode structure 16/18. Dependent on the type of device that is being created, that is a NMOS or a PMOS device, these implants are n-type or p-type impurities that are implanted at an energy of between about 1 KeV and 100 KeV and a density between about 1E12 atoms/$cm^2$ and 5E15 atoms/$cm^2$. Spacers 24 and 48 are next formed on the sidewalls of the gate structure 16/18 and the sidewalls of resistor 17/46 by a blanket deposition of a suitable gate spacer material followed by an isotropic etch back of the deposited gate spacer material. Gate spacers 24 typically have a thickness of-between 300 and 2000 Angstrom.

Source region 26 and drain region 28 are next formed in the surface of substrate 10. For NMOS devices, the implant for the source and drain regions uses n-type impurities such as arsenic or phosphorous, for PMOS devices a p-type implant such as indium or boron can be used. Implant for the source and drain regions are typically performed at an energy of between about 1 KeV and 100 KeV and an impurity concentration of between about 1E15 atoms/$cm^2$ and 8E15 atoms/$cm^2$. Impurity implants that have been performed into the surface of the substrate for the creation of source and drain regions can further be activated (further driven into the surface of the substrate) by performing a rapid thermal anneal after the implant has been completed.

The surface of the gate electrode structure 16/18 and the surface of resistor 17/46 can next be salicided in order to reduce the contact resistance with the gate electrode. This saliciding of the surface of the gate electrode 16/18 and the surface of the resistor 17/46 also salicides the surface regions of the source (26) and drain (28) regions of the gate electrode 12. As an example can be cited the formation of a layer of titanium salicide on the surface of layer 18 of polysilicon of the gate electrode 12 and on the surface of layer 46 of the resistor 42. A layer of titanium can be deposited over the surface of the substrate to a thickness between about 300 to 600 $A^0$ at a temperature of 25 to 300 degrees C. using either rf. sputtering or CVD techniques. A first anneal is performed to the layer of titanium to convert the titanium to the salicided stage. The first anneal is a rapid thermal annealing in a temperature range of between about 600 and 800 degrees C. for a time between about 20 and 40 seconds in a nitrogen ambient. The unreacted titanium is then removed from the surface with an etchback using a wet $NH_4OH$ and $H_2O_2$ solution. A CVD titanium can also be etched using a dry $CF_4$ and oxygen environment. A second anneal can be applied to transform the layer of titanium silicide ($TiSi_2$) over the gate electrode region from the high resistivity phase to the low resistivity phase can be applied. The second anneal is a rapid thermal anneal in a temperature range of between about 800 and 900 degrees C. for a time between 20 and 40 seconds in an $N_2$ ambient.

Layer 30 of the gate electrode 12 and layer 44 of resistor 42 have been highlighted as being salicided layers since the process of salicidation can be performed simultaneously with saliciding the source and drain contact points of the gate structure. For the creation of layer 30 and layer 42 tungsten can also be applied. A layer of tungsten can be selectively formed on the surface of the gate electrode 12 and the resistor 42 by CVD deposition at a temperature between about 300 degrees C. and 500 degrees C. and a pressure between about 50 mTorr and 500 mTorr using as source gasses $SiH_4$ and $WF_4$ with a flow ratio of between about 0.1 and 5.0 sccm between these two source gasses.

Further shown in cross section in FIG. 9 is the deposition of a blanket layer 32 over the dummy gate electrode 12 and the resistor 42 and the exposed surface of substrate 10, thereby including the surface of the isolation regions 14 and 15. This layer 32 of dielectric, preferably containing silicon dioxide, is deposited to a thickness such that the surface of layer 32 is at least equal to the surface of the salicided layer 30 on the surface of the dummy gate electrode 12 and the salicided layer 44 on the surface of resistor 42. Dielectric that has been deposited exceeding this height can be removed by Chemical Mechanical Polishing or by methods of etching. Layers 30 and 42 of salicided material are of higher hardness than the surface of the layer 32 of dielectric that is being polished and can therefore serve as a stop layer for the CMP process.

For layer 32 of dielectric the preferred dielectrics are silicon dioxide (doped or undoped), silicon oxynitride, parylene or polyimide, spin-on-glass, plasma oxide or LPCVD oxide.

Figure 10:
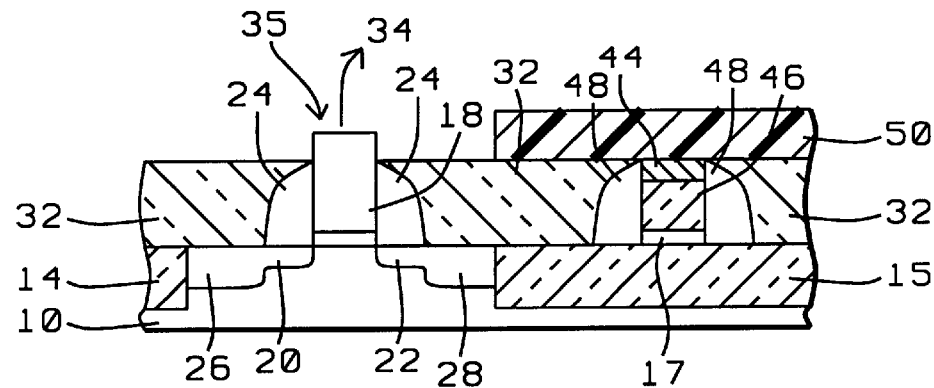

FIG. 10 shows the deposition of a layer 50 of photoresist, layer 50 has been patterned and developed leaving in place a shielding layer of photoresist overlying the resistor 42. The process of deposition and developing the layer 50 of photoresist uses conventional methods of photolithography and masking. Layer 50 of photoresist can be etched by applying $O_2$ plasma and then wet stripping by using $H_2SO_4$, $H_2O_2$ and $NH_4OH$ solution. The photoresist that is removed from the surface of the layer 32 of dielectric exposes gate electrode 12.

FIG. 10 further shows the removal 34 of the dummy gate electrode comprising the layers 16, 18 and 30 from between the gate spacers 24 forming an opening 35 between the gate spacers 24. The dummy plug can be removed using conventional methods of etch, using chlorine as a reactant gas to etch the salicided layer 32 and the polysilicon layer 18, assuring that the etch for the removal of these two layers is highly selective to the silicon dioxide of the surrounding layer 32 of dielectric. The layer 16 of pad oxide can be removed using $CHF_3/CF_4$ or HF etch chemistry. Layer 16 of pad oxide can also be etched using $Ar/CF_4$ as an etchant at a temperature of between about 120 and 160 degrees C. and a pressure of between about 0.30 and 0.40 Torr for a time of between about 33 and 39 seconds using a dry etch process.

Figure 11:
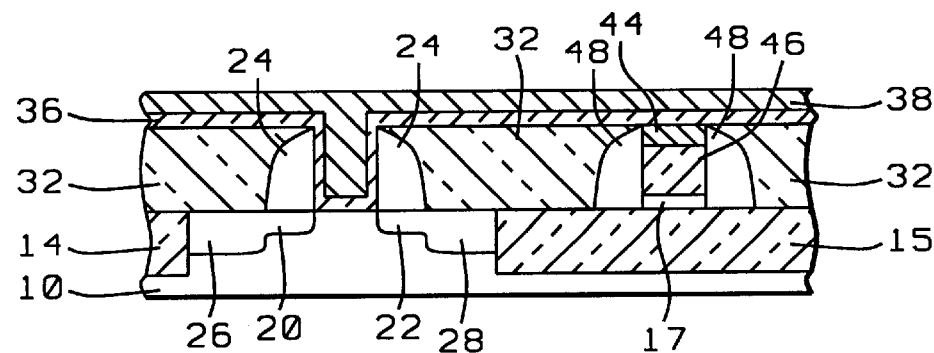

Referring now to FIG. 11, a layer 36 of high-k gate dielectric is deposited over the surface of layer 32 and the inside surfaces of opening 35 that has been created between gate spacers 24. Optionally and prior to the deposition of a layer 36 of high-k dielectric, a layer of gate oxide can be formed on the bottom of the opening that is created in the layer of dielectric by the removal of the dummy gate. Over the surface of the high-k dielectric layer 36 is deposited a layer 38 of metal that is deposited to a thickness sufficient to fill opening 35. The metal that is used for layer 38 is composed of a metal selected from the group comprising titanium, tungsten, copper or aluminum and can be deposited using methods of Plasma Enhanced Chemical Vapor Deposition (PECVD), sputtering or Chemical Vapor Deposition (CVD). The gate electrode can further comprise a barrier layer of a material selected from the group comprising titanium nitride, tantalum, tungsten, niobium, molybdenum, Ti/TiN or Ti/W and is more preferably formed from TiN. Copper interconnects should be encapsulated by at least one diffusion barrier to prevent diffusion into the silicon dioxide layer. Silicon nitride is a diffusion barrier to copper, the prior art teaches that copper interconnects should not lie on a silicon nitride layer because it has a high dielectric constant compared with silicon dioxide. The high dielectric constant when applied with interconnects causes an undesired increase in capacitance between the interconnects and the substrate. For the case of a metal gate electrode, a high-k dielectric is required for the metal structure making silicon nitride a desirable dielectric for copper applications. As examples of materials that can be used for layer 36 can be cited SiN and $Al_2O_3$ which are dielectric materials with a high dielectric constant (SiN-7.4, $Al_2O_3$-8.5).

Figure 12:
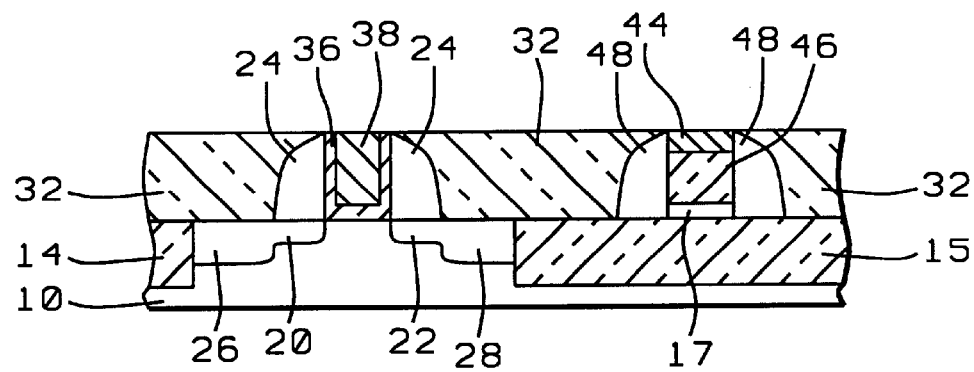

Referring to FIG. 12, this cross section shows the results that are obtained by polishing the surface of layer 38 down to the surface of the layer 32 of dielectric. Metal gate electrode 12 and polysilicon resistor 42 have been created on the surface 10 during one processing stream.

From the cross sections that are shown in FIGS. 9 through 12, it is clear that the conductivity of the resistor 42 can be controlled by impurity implant with an impurity dosage that is required to establish the desired target polysilicon resistor dosage and the thereby controlled resistivity value. This implant is preferably selectively performed into the surface of resistor 42 prior to the process of saliciding the surface of resistor 42 but is not limited to being performed at that time. This processing step equally applies to the cross sections that are shown in the following FIGS. 13 through 16.

Figure 13:
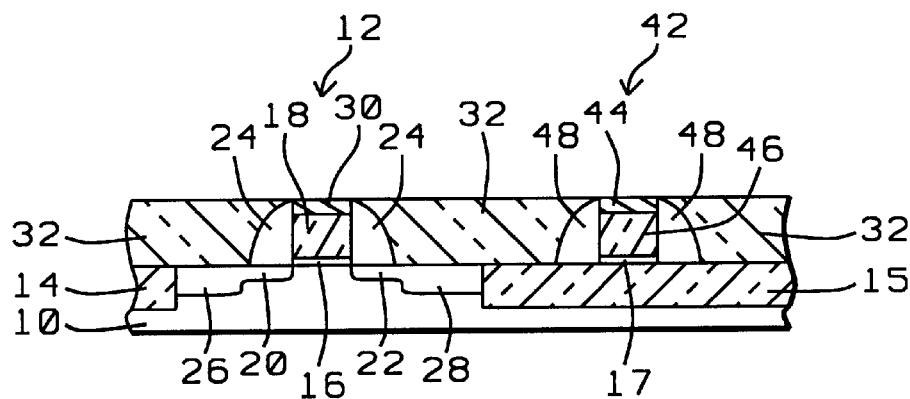
FIGS. 13 through 16 show a cross section of an etch back type metal plug that is created concurrent with the creation of a polysilicon resistor, as follows.
Figure 14:
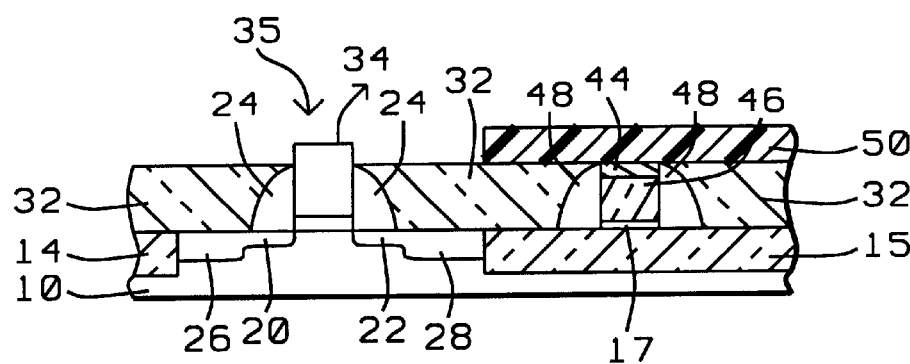
Figure 15:
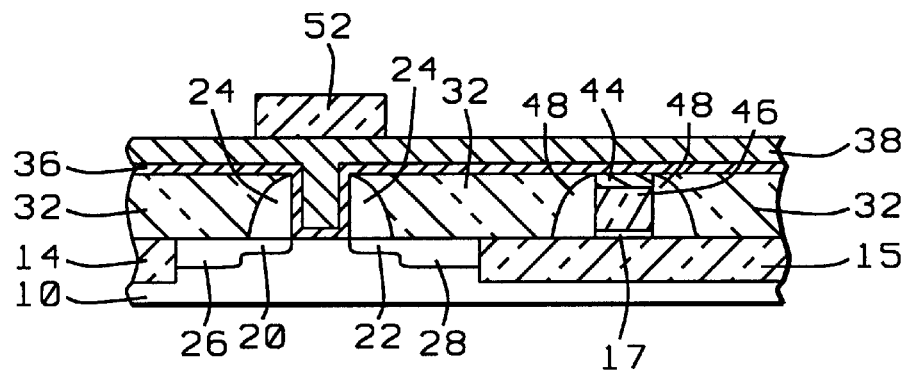
Figure 16:
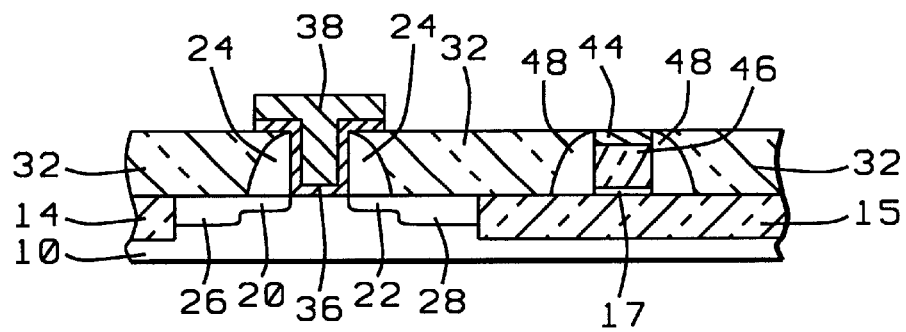

The metal gate electrode that is shown in cross section in FIG. 12 provides a metal gate with a damascene type plug. As an alternate process, the surface of the metal gate electrode can be extended as is shown in cross section in FIGS. 13 through 16. FIGS. 13 and 14 are identical with FIGS. 9 and 10 and are therefore not further addressed at this time. FIG. 15 is partially identical with FIG. 11, the difference between FIG. 15 and FIG. 11 is that in FIG. 15 a layer 52 of photoresist has been deposited and patterned and etched over the surface of the layer 38 of metal. The patterning and etching has removed the layer 52 of photoresist from the surface regions of layer 38 that surround the gate electrode 12, leaving a patterned layer 52 in place overlying the gate electrode 12. By using the patterned layer 52 of photoresist as a mask, layers 36 and 38 can be removed from the surface of the layer 32 of dielectric except in the surface regions of layer 38 where the patterned layer 52 of photoresist prevents the removal of these layers. This leads to a cross section that is shown in FIG. 16, whereby the gate electrode has been provided with a cap for improved connectivity to the gate electrode. After layers 36 and 38 have been etched as indicated, the patterned layer 52 of photoresist is removed from the surface of layer 38.

The advantages that are provided by the invention can be summarized as follows:

the invention creates a polysilicon resistor the invention creates the polysilicon resistor concurrent with the creation of a metal gate the invention eliminates the need for a separate processing step of depositing a layer of polysilicon for the creation of a polysilicon resistor, and for the formation of a polysilicon resistor, the processing steps of deposition of the polysilicon and subsequent impurity ion implants (to adjust values of resistivity of the resistor) may require processing conditions of high temperature processing. High temperature processing cannot be tolerated during the formation of metal gate structures.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for simultaneous formation of a metal gate using a replacement gate process and a polysilicon resistor, comprising the steps of:

providing a semiconductor substrate, said substrate having been provided with at least one active surface region surrounded by surface regions of electrical isolation;

forming a layer of oxide on the surface of said substrate;

forming a layer of polysilicon on the surface of said layer of oxide;

patterning and etching said layer of polysilicon and said layer of oxide to form a dummy gate having sidewalls, further forming a resistor having sidewalls;

forming spacers on said sidewalls of said dummy gate and on said sidewalls of said resistor;

saliciding the surface of said dummy gate and said resistor, creating a salicided layer on the surface of said dummy gate and a salicided layer on the surface of said resistor;

forming a blanket layer of dielectric over said dummy gate and said resistor and exposed surfaces of said substrate;

planarizing said blanket layer of dielectric using chemical mechanical polishing process and stopping on said salicided surfaces of said dummy gate and said resistor;

removing said salicided layer from the surface of said dummy gate and removing said dummy gate, forming a gate opening in said layer of dielectric;

blanket depositing a layer of high-k dielectric over the surface of said layer of dielectric, including inside surfaces of said gate opening;

blanket depositing a layer of metal over the surface of said layer of high-k dielectric; and planarizing said layer of metal and said layer of high-k dielectric down to the surface of said layer of dielectric.

2. The method of claim 1 further comprising the step of forming a gate oxide layer on the surface of said substrate inside said opening, said step to be performed prior to said step of blanket depositing a layer of high-k dielectric over the surface of said layer of dielectric.

3. The method of claim 1 further comprising the step of depositing a barrier layer over the surface of said layer of dielectric including inside surfaces of said gate opening created in said layer of dielectric, said additional step to be performed prior to said step of blanket depositing a layer of high-k dielectric over the surface of said layer of dielectric.

4. The method of claim 3 wherein said barrier layer comprises a material selected from a group consisting of titanium nitride and tantalum and tungsten and niobium and molybdenum and Ti/TiN and Ti/W and is more preferably formed from TiN.

5. The method of claim 1 wherein said polysilicon is in-situ implanted with an impurity ion concentration, whereby said impurity ion concentration is adjusted to establish a required value of resistivity for said resistor.

6. The method of claim 1 wherein said polysilicon has been implanted with an impurity ion concentration, whereby said impurity ion concentration is adjusted to establish a required value of resistivity for said resistor.

7. The method of claim 1 wherein said removing said salicided layer from the surface of said dummy gate and removing said dummy gate, forming a gate opening in said layer of dielectric comprises the steps of:

depositing a first layer of photoresist over the surface of said layer of dielectric;

patterning said first layer of photoresist, removing said first layer of photoresist from above said dummy gate, exposing the surface of said dummy gate, further partially exposing the surface of said layer of dielectric, said partial exposure of the surface of said layer of dielectric being adjacent to the surface of said dummy gate;

removing said salicided surface and said layer of polysilicon of said dummy gate using chlorine as a reactant gas, creating a first opening having a bottom surface in said layer of dielectric, partially exposing said layer of oxide at the bottom of said first opening;

removing said layer oxide from the bottom surface of said first opening using $CHF_3/CF_4$ or HF etch chemistry; and removing said patterned and etched first layer of photoresist from the surface of said layer of dielectric.

8. The method of claim 1 wherein said removing said salicided layer from the surface of said dummy gate and removing said dummy gate, forming a gate opening in said layer of dielectric comprises the steps of:

depositing a first layer of photoresist over the surface of said layer of dielectric;

patterning said first layer of photoresist, removing said photoresist from above said dummy gate, exposing the surface of said dummy gate, further partially exposing the surface of said layer of dielectric;

removing said salicided surface and said layer of polysilicon of said dummy gate using chlorine as a reactant gas, creating a first opening having a bottom surface in said layer of dielectric, partially exposing said layer of oxide at the bottom of said first opening;

removing said layer oxide from the bottom surface of said first opening using $Ar/CF_4$ as an etchant at a temperature of between about 120 and 160 degrees C. and a pressure of between about 0.30 and 0.40 Torr for a time of between about 33 and 39 seconds using a dry etch process; and removing said patterned and etched first layer of photoresist from the surface of said layer of dielectric.

9. The method of claim 1 wherein said dielectric comprises a material selected from a group consisting of silicon dioxide, silicon oxynitride, parylene or polyimide, spin-on-glass, plasma oxide or LPCVD oxide but more preferably comprising silicon dioxide.

10. A method for the simultaneous formation of a metal gate using a replacement gate process and a polysilicon resistor, comprising the steps of:

providing a semiconductor substrate, said substrate having been provided with at least one active surface region surrounded by surface regions of electrical isolation;

forming a layer of oxide on the surface of the substrate;

forming a layer of polysilicon on the surface of said layer of oxide;

patterning and etching said layer of polysilicon and said layer of oxide to form a dummy gate having sidewalls, further forming a resistor having sidewalls, said dummy gate being aligned with an active surface region of said substrate, said resistor being aligned with a region of electrical isolation in the surface of said substrate;

selectively implanting impurity ions into said substrate using said dummy gate as an implant mask, forming Lightly Doped Diffusion (LDD) source and drain regions in the substrate that are self-aligned with said dummy gate;

forming spacers on said sidewalls of said dummy gate and on said sidewalls of said resistor;

implanting impurity ions into the surface of said substrate using said dummy gate and said spacers on said sidewalls of said dummy gate as an implant mask and performing a rapid thermal anneal to form source and drain regions in the substrate that are self-aligned with said dummy gate;

saliciding the surface of said dummy gate and said resistor, creating a salicided layer on the surface of said dummy gate and a salicided layer on the surface of said resistor;

forming a blanket layer of dielectric over said dummy gate and said resistor and exposed surfaces of said substrate;

planarizing said blanket layer of dielectric using chemical mechanical polishing process and stopping on said salicided surfaces of said dummy gate and said resistor;

removing said salicided layer from the surface of said dummy gate and removing said dummy gate, forming a gate opening in said layer of dielectric;

blanket depositing a layer of high-k dielectric over the surface of said layer of dielectric, including inside surfaces of said opening, said layer of high-k dielectric comprising a dielectric selected from the group consisting of silicon nitride and $Al_2O_3$;

blanket depositing a layer of metal over the surface of said layer of high-k dielectric, said metal comprising a metal selected from the group consisting of titanium and tungsten and copper and aluminum; and patterning and etching said layer of metal and said layer of high-k dielectric, creating a pattern of metal and high-k dielectric overlying said metal gate.

11. The method of claim 10 further comprising the step of forming a gate oxide layer on the surface of said substrate inside said gate opening, said step to be performed prior to said step of blanket depositing a layer of high-k dielectric over the surface of said layer of dielectric.

12. The method of claim 10 further comprising the step of depositing a barrier layer over the surface of said layer of dielectric including inside surfaces of said opening created in said layer of dielectric, said additional step to be performed prior to said step of blanket depositing a layer of high-k dielectric over the surface of said layer of dielectric.

13. The method of claim 12 wherein said barrier layer comprises a material selected from a group consisting of titanium nitride and tantalum and tungsten and niobium and molybdenum and Ti/TiN and Ti/W and is more preferably formed from TiN.

14. The method of claim 10 wherein said polysilicon is in-situ implanted with an impurity ion concentration, whereby said impurity ion concentration is adjusted to establish a required value of resistivity for said resistor.

15. The method of claim 10 wherein said polysilicon has been implanted with an impurity ion concentration, whereby said impurity ion concentration is adjusted to establish a required value of resistivity for said resistor.

16. The method of claim 10 wherein said removing said salicided layer from the surface of said dummy gate and removing said dummy gate, forming a gate opening in said layer of dielectric comprises the steps of:

depositing a first layer of photoresist over the surface of said layer of dielectric;

patterning said first layer of photoresist, removing said photoresist from above said dummy gate, exposing the surface of said dummy gate, further partially exposing the surface of said layer of dielectric, said partial exposure of the surface of said layer of dielectric being adjacent to the surface of said dummy gate;

removing said salicided surface and said layer of polysilicon of said dummy gate using chlorine as a reactant gas, creating a first opening having a bottom surface in said layer of dielectric, exposing said layer of oxide at the bottom of said first opening;

removing said layer oxide from the bottom surface of said first opening using $CHF_3/CF_4$ etch chemistry; and removing said patterned and etched first layer of photoresist from the surface of said layer of dielectric.

17. The method of claim 10 wherein said removing said salicided layer from the surface of said dummy gate and removing said dummy gate, forming a gate opening in said layer of dielectric comprises the steps of:

depositing a first layer of photoresist over the surface of said layer of dielectric;

patterning said first layer of photoresist, removing said photoresist from above said dummy gate, exposing the surface of said dummy gate, further partially exposing the surface of said layer of dielectric, said partial exposure of the surface of said layer of dielectric being adjacent to the surface of said dummy gate;

removing said salicided surface and said layer of polysilicon of said dummy gate using chlorine as a reactant gas, creating a first opening having a bottom surface in said layer of dielectric, exposing said layer of oxide at the bottom of said first opening;

removing said layer oxide from the bottom surface of said first opening using $Ar/CF_4$ as an etchant at a temperature of between about 120 and 160 degrees C. and a pressure of between about 0.30 and 0.40 Torr for a time of between about 33 and 39 seconds using a dry etch process; and removing said patterned and etched first layer of photoresist from the surface of said layer of dielectric.

18. The method of claim 10 wherein said dielectric comprises a material selected from a group consisting of silicon dioxide, silicon oxynitride, parylene or polyimide, spin-on-glass, plasma oxide or LPCVD oxide but more preferably comprising silicon dioxide.

19. The method of claim 10 wherein said patterning and etching said layer of metal and said layer of high-k dielectric, creating a pattern of metal and high-k dielectric overlying said dummy gate comprises the steps of:

depositing a second layer of photoresist over the surface of said layer of metal;

patterning and etching said second layer of photoresist, creating a pattern of photoresist that aligns with said dummy gate electrode;

etching said layer of metal and said layer of high-k dielectric, leaving in place a pattern of said layer of metal and said layer of high-k dielectric that aligns with said metal gate; and removing said patterned second layer of photoresist from the surface of said patterned layer of metal.

* * * * *